United States Patent [19]

Cisar et al.

[11] Patent Number: 5,512,831
[45] Date of Patent: Apr. 30, 1996

[54] METHOD AND APPARATUS FOR TESTING ELECTROCHEMICAL ENERGY CONVERSION DEVICES

[75] Inventors: Alan J. Cisar, Cypress; Oliver J. Murphy, Bryan, both of Tex.

[73] Assignee: Lynntech, Inc., College Station, Tex.

[21] Appl. No.: 344,285

[22] Filed: Nov. 23, 1994

[51] Int. Cl.$^6$ .......................... G01N 27/403; G01R 19/00
[52] U.S. Cl. .......................... 324/426; 324/425; 324/713; 204/228; 204/406
[58] Field of Search .................... 324/425, 426, 324/429, 433, 713, 714; 204/228, 406

[56] References Cited

U.S. PATENT DOCUMENTS

| | | | |
|---|---|---|---|
| 3,617,845 | 11/1971 | McKenna | 388/828 |
| 4,881,037 | 11/1989 | Bellingham et al. | 324/425 |
| 5,312,538 | 5/1994 | Metrich | 204/406 X |

OTHER PUBLICATIONS

Stephen D. Senturia and Bruce D. Wedlock, *Electronic Circuits and Applications*, Massachusetts Institute of Technology. No date.

Trung V. Nguyen and Ralph E. White, *A Water and Heat Management Model for Proton-Exchange-Membrane Fuel Cells*, J. Electrochem. Soc., vol. 140, No. 8, Aug. 1993.

Robert B. Fleming and Eric G. Pow, *Solid Polymer Fuel Cell Development and Commercialization at Ballard*. No date.

*300 Watt Single Input Electronic Load HP Model 6060A*, Operating Manual for Instruments with Serial Numbers 2847A–00101 and above, Dec. 1988.

*Primary Examiner*—Kenneth A. Wieder
*Assistant Examiner*—Glenn W. Brown
*Attorney, Agent, or Firm*—Gunn & Associates

[57] ABSTRACT

A system for testing electrochemical energy conversion and storage devices includes means for sensing the current from the storage device and varying the load across the storage device in response to the current sensed. The system is equally adaptable to batteries and fuel cells. Means is also provided to sense system parameters from a plurality of locations within the system. Certain parameters are then stored in digital form for archive purposes and certain other parameters are used to develop control signals in a host processor.

13 Claims, 7 Drawing Sheets

METHOD AND APPARATUS FOR TESTING ELECTROCHEMICAL ENERGY CONVERSION DEVICES

This invention was made with Government support under contract NAS3-26998 awarded by NASA. The Government has certain rights in this invention.

FIELD OF THE INVENTION

The present invention relates generally to the field of testing equipment and, more particular, to a method and apparatus for testing electrochemical electrical energy generating and storage devices, such as fuel cells and batteries.

BACKGROUND OF THE INVENTION

Existing equipment for testing electrochemical electrical energy generating and storage devices, such as fuel cells and batteries, are generally not fully optimized for such testing. This is quite apparent in several areas. The first example of such an area is the resistive load used to controllably consume the electrical energy produced or stored.

The simplest system, now rarely used, is a network of switches and resistors. This type of system is shown schematically in FIG. 1. Each resistor R is in series with a switch 10, and each resistor-switch pair is in parallel with all of the others. The parallel combination is placed across a power source, such as a fuel cell 12. As each switch is closed, the total resistance of the network drops. The resistors may be identical in size, or may vary to allow finer control of the total resistance.

One drawback of this system lies in the large number of mechanical contacts of the circuit as a result of the switches. Each mechanical contact adds a varied and changing resistance to the network. In a large network, consisting of a dozen or more switches, the network resistance will never be exactly the same twice. The unavoidable mechanical wear that occurs during use of the switches only adds to the problem by changing the resistance of different switches differently. One solution to this problem is the addition of a variable potentiometer in parallel with the switches, but this offers little improvement. Potentiometers suffer a similar drift in resistance characteristics with wear and age.

The next step in sophistication includes replacing the switches and resistors with field effect transistors (FETs). An FET acts like a resistor whose resistance can be varied over a wide range through the application of a bias voltage to one terminal of the device. In its simplest form a FET-based electronic load, which generally consists of a set of FETs mounted in parallel, is controlled by manually adjusting the gate voltage to produce the desired current flow through the system. This method is a distinct improvement on a resistor/switch network. It eliminates the contact problems present in the switches and gives virtually infinite variability in resistance over the entire available load range. While it is an improvement, this system is still inadequate. It requires manual operation to change the output of the system including periodic readjustments to offset variations produced by thermal effects in the circuit or variations in the cell's performance.

The FET-based circuit can be stabilized by the addition of analog circuitry tuned to measure and compensate for external changes. This circuit can be sufficiently complex to hold a constant current through changes in cell performance and to provide for external control of the load via an analog voltage supplied from an external source. A load of this type is sufficiently sophisticated to permit automation of the test system. The largest problem with this type of load circuit is its complexity. The large number of components involved increases the difficulty in fabrication and increases the chance of at least one component malfunctioning. The difficulty in fabrication and the number of components both contribute to making this an expensive system to produce and difficult to maintain.

Commercially available electronic loads, such as those produced by Hewlett Packard, have been used as loads for fuel cell and battery testing. While they are a distinct improvement on the loads described above, they are still deficient in several respects. They typically have maximum current capabilities on the order of 120 amps. While this is adequate for the uses they were designed for, it is insufficient for a high power density fuel cell. A 50 $cm^2$ fuel cell operating at 3 $A/cm^2$ puts out 150 amps, and some systems are routinely operated at up to 4 $A/cm^2$, while many developers use cells with large areas. These units also have a second deficiency when used to test either single cell fuel cells or batteries. Since they were not designed for fuel cell testing or single cell battery testing, they were designed to operate with a typical minimum potential of 3 volts. If operated at lower voltages, the maximum current capacity is substantially reduced. Most fuel cells reach their maximum power output at around 0.6 volts, and at this voltage a 120 amp load's capacity is reduced to about 40 amps. This can be overcome by placing a power supply in series with the fuel cell or battery being tested to boost the voltage. While this works, there is some risk involved. For instance, if the gas supply to a fuel cell is cut off, the cell voltage can go to zero. Since the power supply is still applying a voltage, it is possible for the cell to be forced into reverse and become an electrolyzer. In this mode, the cell will generate hydrogen in the compartment that had previously contained oxygen, and oxygen in the one that had contained hydrogen. It is readily apparent that an explosive mixture could quickly be formed in either compartment. This is a situation that is to be avoided.

Still another type of electronic load can be constructed using a high speed chopper to turn the current through a fixed resistor on and off at high frequency (>1000 Hz). When the chopper is on, the current flows at the same level as if the resistor were connected directly to the fuel cell. When the chopper is off, the current flow is zero. The duty cycle of the chopper is adjusted so that the total coulombic flux each second is the same as it would be through a fixed resistance larger than that of the actual resistor. One problem with this approach is that a fuel cell responds quite quickly to changes in resistance and tries to track the load. This can bias the results obtained in two ways. One of these is that a fuel cell's performance in a cycling system is not always the same as in a steady state system, even if the two systems have the same time averaged performance. Many types of batteries also show better performance under an intermittent load than a steady one and produce an overly optimistic result when tested under these conditions. The other bias is not in the cell, but in the measurement of the cell voltage under load with a fluctuating load. If the voltmeter being used doesn't average the voltage correctly at the chopper frequency being used, the results will be incorrect. For example, a DC voltmeter used to measure a high frequency AC voltage will give a reading greater than the true root mean square (RMS) value, and this will lead to overly optimistic, inaccurate results.

Humidification of fuel cell reactants is a second area where a variety of methods have been tried previously.

While some have worked quite well, they generally have limitations that the present invention addresses.

The simplest way to humidify a reactant gas stream is to pass the gas as a stream of fine bubbles through water. As long as the gas has sufficient contact time with the water, controlling the temperature of the water controls the amount of water in the gas stream. This method works quite well at low gas flows, but as the required gas flow increases problems begin to arise. To fully saturate the gas with water requires either small bubbles, ideally under 0.5 mm in diameter, or a tall column to allow enough contact time to insure complete saturation. Operating the humidifier under conditions where the gas does not have sufficient contact time to become fully saturated and as a result is carrying a varying amount of water leads to an unstable situation.

While the cell itself is not likely to be damaged, the measurements made under these conditions may not be reproducible. For example, if a contact time of 0.5 seconds is required to saturate the bubbles with water, the column will need to be at least 19 cm tall (based on Stokes law velocity of 38.2 cm/sec for a 0.5 mm bubble of air in water at 80° C.). For a flow rate of one liter of gas per minute, as 0.5 mm bubbles with an average spacing of 0.5 mm, a water volume of over 300 $cm^3$ is required, with a similar or greater volume for the reverse portion of the convective flow produced by the gas lifting the water. Additional volume is required for the disperser to form the bubbles and for a reserve of water to replenish that lost to evaporation. The resulting humidifier has a volume of over one liter, and any increase in gas flow will require an even larger volume.

Another method that has been used is to humidify the gas inside the cell assembly, or stack, itself. This is usually done with a membrane humidifier. In this type of humidifier, a stream of water is located on one side of a water permeable membrane and the gas steam flows on the other side. This membrane may or may not be the same material as is used for the fuel cell. This method uses the heat of the cell itself to evaporate the water. This is both an advantage and a disadvantage. It eliminates the need for separate heaters to humidify the gas streams, but it limits the humidification of the gas streams to a dew point that is essentially the same as the cell's operating temperature. It also adds to the size of the cell stack. Since the humidifier is a structural part of the stack, it has to be built to serve as a supporting member. This can increase the weight and size of the system by a greater amount than is required for an external humidification system. Extra weight is always a disadvantage. This is the type of humidifier that is used in the well-known Ballard fuel cell system.

Still another humidification method is to inject water directly into either the manifold of the cell or stack, or a gas line leading into the manifold. The water is injected in such a manner as to form a mist in the gas line. As the gas stream is heated by the cell the water, which has a high surface area due to its small droplet size, quickly evaporates. This type of humidifier produces a very compact humidification system. The amount of water in the gas stream can easily be controlled by metering the liquid water feed into the cell. While this is a good system for stacks in the kilowatt range and larger, it is not an effective system for smaller systems. The weak point is the difficulty encountered in forming a steady consistent mist at low water flow rates. For instance, a nominally 1 kW stack consisting of six cells, each at 0.6 V, operating at 85° C. with both the fuel and air streams humidified, requires about 10.3 grams of water per minute to humidify its air stream, assuming a 2:1 air to current stoichiometry at 30 psig. This amount is easily meterable on a consistent basis. A smaller stack, generating 300 W at 70° C. requires only 1.50 grams of water per minute under the same feed conditions. This amount can be metered, but the higher precision required to maintain a smooth flow at the lower feed rate results in the smaller stack actually requiring a more complex humidifier. In the case of a small single cell operating at 30W, and the same operating conditions as above, the feed rate drops to 0.150 grams of water per minute for the air stream, and even less for the fuel gas stream. At these rates maintaining a steady flow is extremely difficult. Using a mist type humidifier under these conditions makes controlling the humidifier the most difficult part of operating the test cell.

Thus, there remains a need for a stable test system for testing electrochemical devices, such as fuel cells and batteries. Fine control of the humidification process, as well as accurate and reproducible control of the other components of the system, are paramount. Like the other items discussed above, a variety of methods have been used to control such test systems. The simplest and most basic system is direct manual control. This involves a trained operator reading a set of individual displays (dial gauges, digital voltmeters, strip chart recorders, etc.) and making all of the adjustments by hand. In this type of system, flow control is usually handled with a needle valve rotameter assembly. This method has poor precision, with the error in the measurement increasing with the flow rate. Although the flow is stable while both the back pressure and the feed pressure remain stable, changes in either pressure leads to changes in the flow rate. This can require frequent readjustment. Actual flow settings are determined with either a precalculated lookup table or recalculation for each adjustment. Load bank control is achieved by the operator manually adjusting the resistance as needed to maintain a stable current through the current measuring device. Since the load is held at a fixed resistance between resettings, any change in the cell's voltage is instantly reflected in a change in the cell's amperage. Needless to say, operating such a unit for an extended period requires a constant effort. Extended operation in the absence of an operator requires the addition of some type of safety shutoff. Since such a shutoff is perforce a simple one, it produces an immediate shutdown of the entire system which can cause damage to delicate components, such as the membrane of the humidifier. Run time and run continuity are lost in such a situation, even if the actual problem is a minor one.

Some of these problems can be eliminated through the use of electronic controls in place of the manual ones. For instance, replacing the needle valve rotameter assemblies with electronic mass flow controllers provides flow control that is independent of changes in gas pressure over a wide range. Settings for the mass flow controllers are obtained as described above. If an electronic load is being used, a feedback circuit can be used to maintain a steady current once the current has been set.

Some test stand designs use a separate computer to control all or part of the system. This is a great improvement on either of the control schemes described above. The combination of the computer with the mass flow controllers allows correct calculation of the gas requirements as the gas is needed.

Thus, there remains a need for a comprehensive test apparatus and method for control and testing of electrochemical generation and storage devices. If such a device is a fuel cell, the system must include a finely controlled humidifier that operates over a wide range of gas flow rates. The apparatus and method must also include means for automatically controlling an electronic load to accommodate variations in cell performance. Such a system therefore requires a plurality of data sensing and control functions.

SUMMARY OF THE INVENTION

The present invention addresses these and other drawbacks of the prior art using several unique parts, the application of known techniques to new areas, and the combination of those parts and techniques, with other, standard components to create such a desired comprehensive system.

The unique portions of the present invention include a digitally controlled resistive load circuit comprising a number of FETs, preferably but not necessarily more than one. When the number is greater than one, the usual case, the FETs are matched and connected in parallel with the entire set in series with a metering shunt. The voltage drop across the metering shunt is read by a computer, either directly through an analog to digital (A/D) converter or digital voltmeter or indirectly through intermediate analog components which serve to condition the signal. The computer compares the observed value with the desired value. If they are not adequately in agreement, the computer determines a new setting for the gate voltage of the FETs using the known characteristics of the FETs and makes the adjustment. The computer carrying out this control function may be either an independent unit or the same unit that is controlling the remainder of the testing apparatus, but is preferably the latter.

The novel applications of known techniques include the use of a set of multiple parallel water permeable tubes to controllably humidify the gas being fed to a fuel cell. Control of the humidity may be by either control of the temperature at which the humidification occurs or by control of the gas flow rate through the system, or both.

The combination of parts and techniques includes all of the following: (1) the components needed to control the feed of a multiplicity of gases to a fuel cell including stopping and starting the flow of those gases, (2) selecting the gases to be used, (3) controlling the flow of those gases, and (4) controlling the pressure of those gases. At least some of these functions are controlled by a built-in digital computer and all of them may be controlled by that computer. The present invention further includes the components needed to add moisture to the gas streams in a controllable manner as needed by the fuel cell and to remove any excess gas from the stream of gas exiting the cell. This excess gas removal is handled in such a manner as to insure that liquid water does not interfere with any of the control or measurement devices in the system.

The components needed to consume the energy produced by the fuel cell or battery in a controllable manner and dispose of such energy harmlessly are also features of the present invention. The control system coordinates all of the functions described here. The present invention further provides components needed to display the current values of all of the relevant parameters and to store such values in such a manner that the values can be retrieved later for further use. This storage may be through either magnetic media or hard copy output.

These and other features of the present invention will be apparent to those of skill in the art from a study of the following detailed description along with the accompanying drawing figures.

DETAILED DESCRIPTION OF A PREFERRED EMBODIMENT

Figure 1:
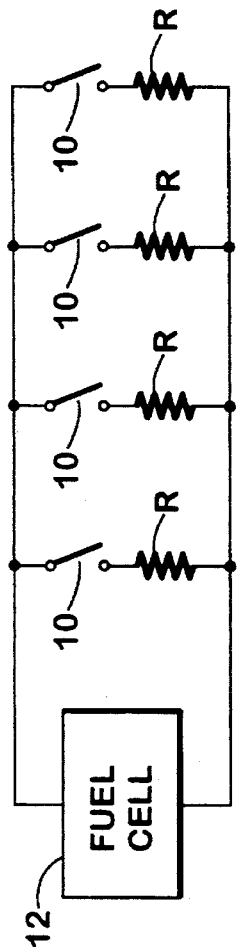
FIG. 1 depicts a prior art test rig including a plurality of parallel resistors and switches.

The load described below is shown schematically in FIG. 2. It consists of three matched FETs 20, in this case model number MTP75N05HD from Motorola. The FETs are connected in parallel and mounted on a tinned aluminum heat sink 22. The heat sink is used to transfer the heat, generated by the FETs as they dissipate the electric current passing through them, to the air. To enhance this heat transfer, a fan may be used to direct a stream of air over the heat sink. This assembly is connected in series with a standard metering shunt 24 with a resistance of 1 m$\Omega$, normally described as having a voltage drop of 100 mV for each 100A of current passing through it. The metering shunt 24 is connected across a cell 25 under test. A pair of nodes 27 and 29 are adapted to receive the cell 25 under test.

The voltage drop occurring in this shunt is amplified, for example by an op-amp 26, to reduce the interference caused by spurious electronic signals induced in the signal loop (noise) and fed to the analog-to-digital (A/D) converter portion 28 of the computer as a 0.0–5.0 V signal. The computer compares the observed current to the desired one. If they do not agree within the limits defined by the operator, the computer uses the known relationship between the gate voltage applied to the transistors 20 and the resistance of those transistors and calculates a new gate voltage which will provide a resistance which produces the correct current flow. This new gate voltage, or operating point, is provided by a digital to analog (D/A) converter portion 30 of the host computer. The analog signal is provided through a fine control 32, preferably −2.5 to +2.5 volts, and a coarse control 34, preferably 0–10 volts. The controls 32 and 34 are added in a summing network 36 and provided to the FETs 20.

Since the polarization characteristics of a battery or fuel cell are not linear, the new value for the gate voltage may not be exactly correct, but it will be closer to the desired value. These deviations are progressively eliminated by iterative application of the correction process.

In this design, the resolution of the digital-to-analog (D/A) converter 30, at 1 part in $2^{12}$ (1 part in 4096, commonly referred to as 12 bit resolution) was found to be insufficient for proper control. To alleviate this, two channels of control 32 and 34 were used, linked as shown to produce higher resolution. In this example, one channel generates a 0–10 V signal, giving coarse control over the entire gate voltage range of the FETs and the other generates a ±2.5 V signal for fine control. The fine voltage is divided by two by the resistors in the summing network 36 and added to the coarse signal by the circuit illustrated to produce a gate voltage resolution of 0.6 mV.

Figure 3:
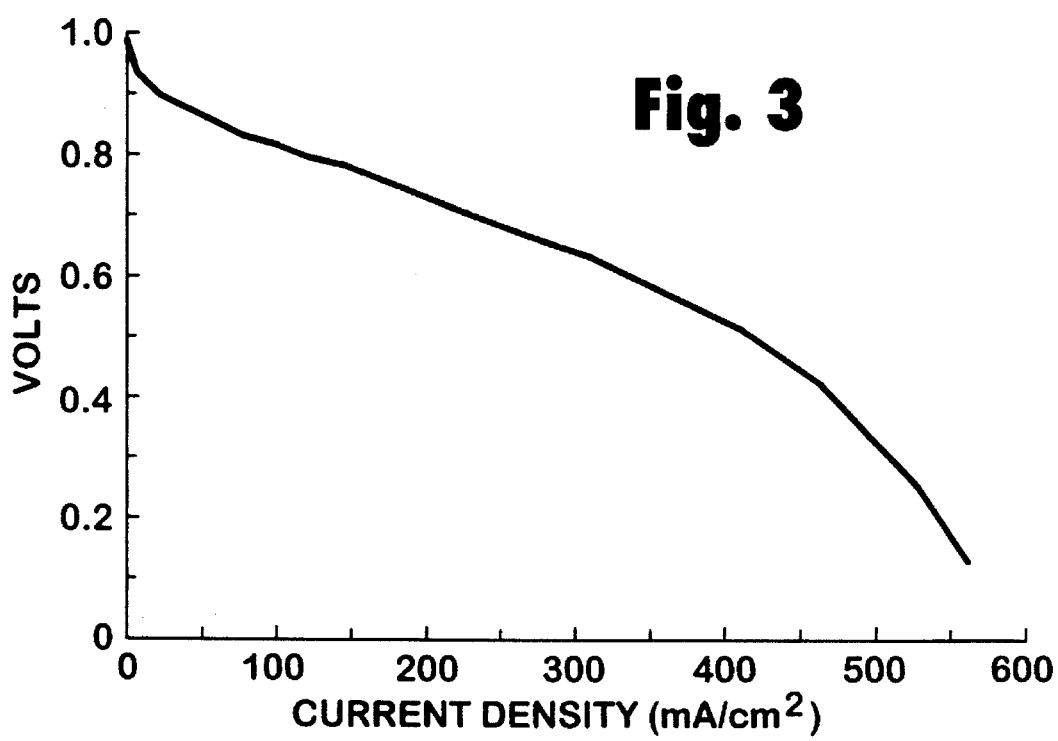
FIG. 3 is a plot of the voltage across a load circuit with varying current density using a small, low pressure fuel cell.
Figure 4:
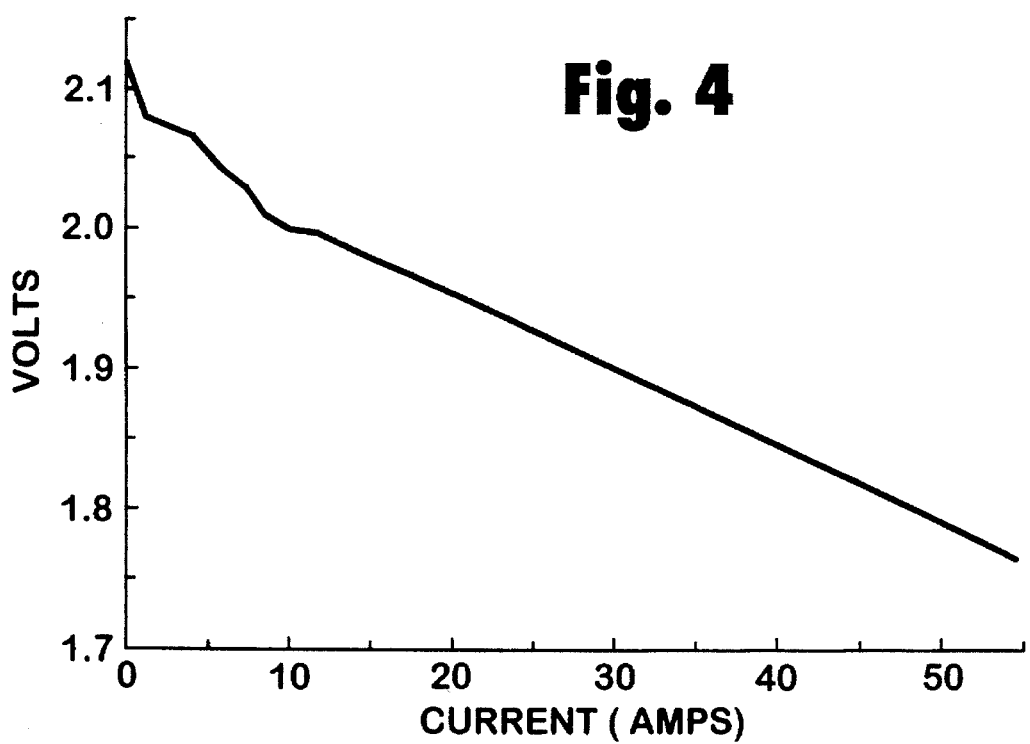
FIG. 4 is a plot of the voltage across a load circuit with varying current density using a single cell from a 12 volt battery.

An example of the data produced by this load appear in FIGS. 3 and 4. FIG. 3 demonstrates the results obtained from a small, low pressure fuel cell. This is a low power, low voltage, device. This load circuit gave excellent control over the entire test range.

FIG. 4 shows the results when this circuit was used to evaluate the performance of a single cell isolated within a 12 Volt lead-acid battery. For the experiment shown here, a standard forklift battery was modified to electrically isolate a single cell. The current was controlled over a range of over 50 Amps, and the cell voltage at each current determined.

Figure 5:
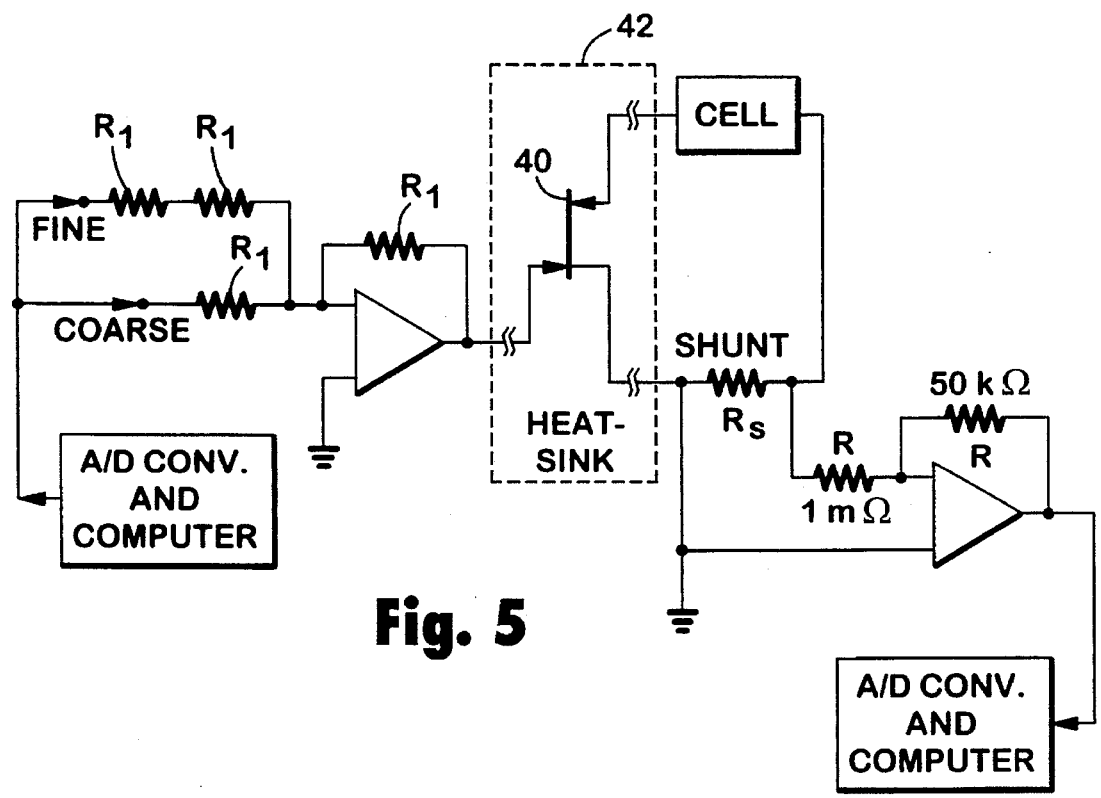
FIG. 5 depicts another preferred embodiment of the present invention including 16 parallel field effect transistors.

The circuit shown in FIG. 5 shows a larger scale load capable of handling the relatively high power output of larger fuel cells and battery systems. A larger load was constructed utilizing 16 matched FETs 40 of the same type as were used in the previous embodiment and mounted on an air cooled heat sink plate 42 to dissipate the current. The remaining components of the load circuit of FIG. 5 operate in manner like those of FIG. 2.

Figure 6:
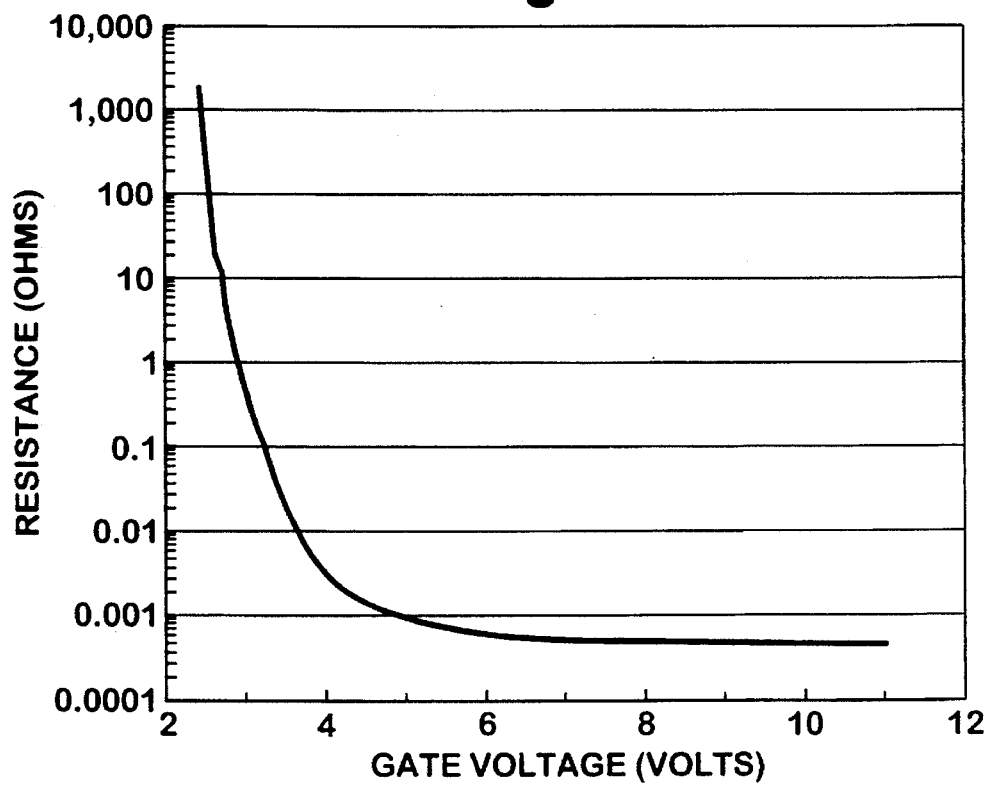
FIG. 6 is a plot of the variation in the resistance of the load circuit of FIG. 5 over its entire accessible range.
Figure 7:
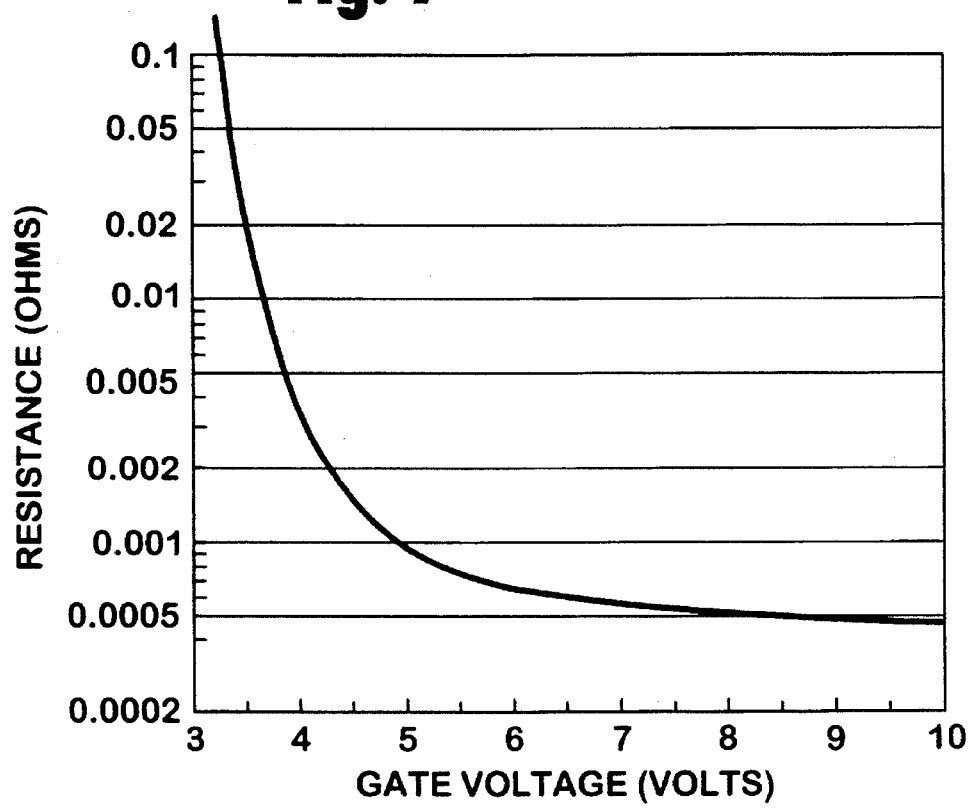
FIG. 7 is a plot of the most useful portion of the resistance curve of FIG. 6.

A plot of the resistance of the 16-FET load bank as a function of the applied gate voltage appears in FIG. 6. Since low resistances are the most useful when working with low voltage devices, the resistance curve is replotted with that portion emphasized in FIG. 7.

Figure 11:
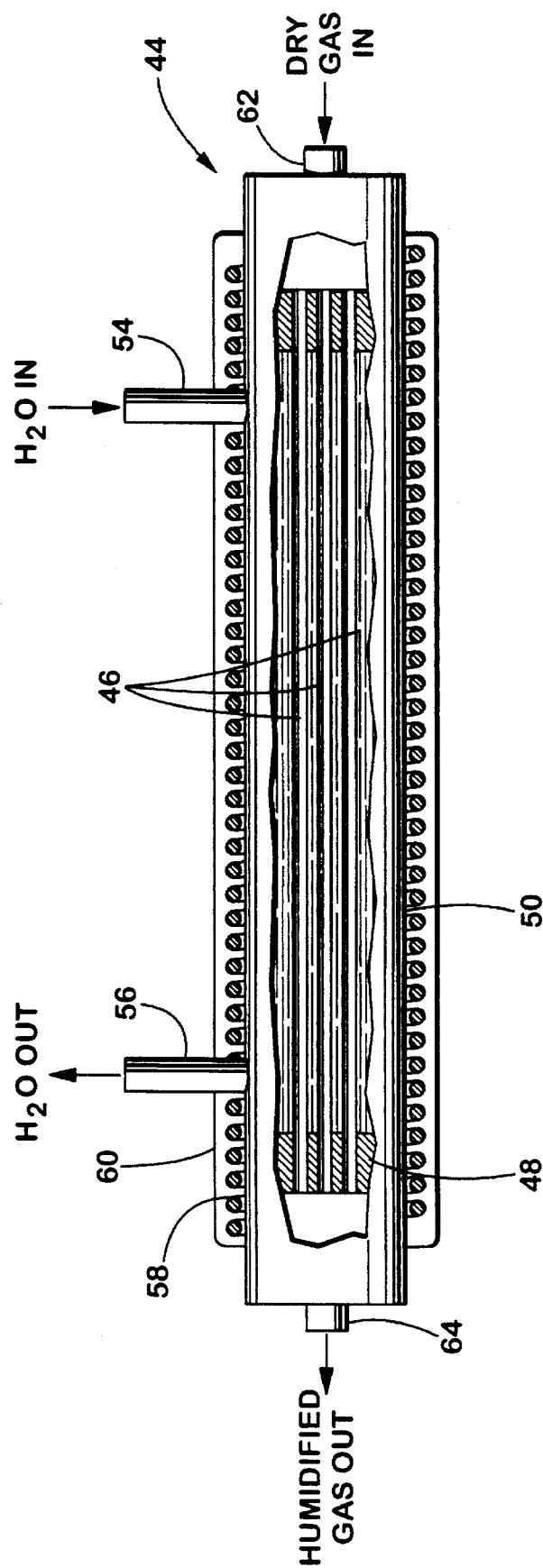
FIG. 11 depicts a partial section view of a gas humidifier that finds application in the present invention.

As previously described, one problem with gas flow in fuel cells is the need for controllable humidity for stable performance. FIG. 11 depicts a humidifier 44 comprising ten parallel Nafion™ tubes 46 mounted in common polypropylene end plugs 48 inside a stainless steel jacket 50 with attachment points on the ends to feed gas into the Nafion™ tubes using that portion of the stainless steel jacket beyond the polypropylene plugs as a gas manifold 52. Connections 54 and 56 on the sides feed water into the jacket around the outside of the tubes 46 and remove water from the jacket, respectively. Elements of the humidifier including the Nafion™ tubes were obtained from Perma Pure Products, Inc., Tom's River, N.J.

A heating element 58 with a resistance of 90 ohms (not shown) was wrapped around the outer jacket and covered with fiberglass insulation 60. Allowing for a few additional ohms of resistance in the contacts and leads, this heater will supply about 140 Watts of heat to the assembly. The unit was then mounted on a standard laboratory stand with the Nafion™ tubes 46 oriented vertically. A lower gas fitting 62 was attached to a feed line from a nitrogen cylinder. An upper gas fitting 64 was vented to the room. The lower water fitting 54 was plugged and the upper fitting 56 connected to a tube leading to a standard laboratory burette. The burette was used as a water reservoir with the calibration lines on the burette allowing the easy measurement of the amount of water vaporized by the humidifier.

Gas was fed at constant pressure and the flow controlled with a needle valve. The flow rate was measured by displacement at the start and end of each measurement. Temperature was controlled by a solid state temperature controller, using a Type J thermocouple attached to the outside of the heater and under the insulation.

The following procedure was used for each measurement:
i.) start gas flow
ii.) set temperature controller to the desired value
iii.) Allow the system to come to thermal equilibrium
iv.) measure gas flow and record water level
v.) allow unit to stand for 60–90 minutes occasionally recording the water level
vi.) record final water level and measure gas flow The data collected was used to calculate the dew point achieved in the exit gas stream based on the amount of water evaporated into the amount of gas passing through the humidifier. The results are recorded in Table I.

TABLE I

| RUN | TEMPERATURE | FLOW (l/m) | DEW POINT |
| --- | --- | --- | --- |
| 1 | 60° C. | 1.80 | 58° C. |
| 2 | 60° C. | 3.95 | 48° C. |
| 3 | 80° C. | 3.72 | 61° C. |
| 4 | 80° C. | 2.55 | 64° C. |
| 5 | 90° C. | 2.09 | 72° C. |

The actual temperature of the water inside the humidifier was not measured, but it was clearly less than that of the heater. This is based on subjective evidence, most notably condensation forming on the exterior of the humidifier at the bottom in the region between the gas inlet and the start of the heater points to a large spread between the temperature outside the heater and the temperature in the water. This is reinforced when the amount of heat lost from the system by evaporation is taken into account. This value reached as high as 22 Watts, or a substantial portion of the heat put out by a 140 Watt heater with a duty cycle of about 25%. It is clear that this method can easily humidify the amount of gas used by most small fuel cells.

Figure 8:
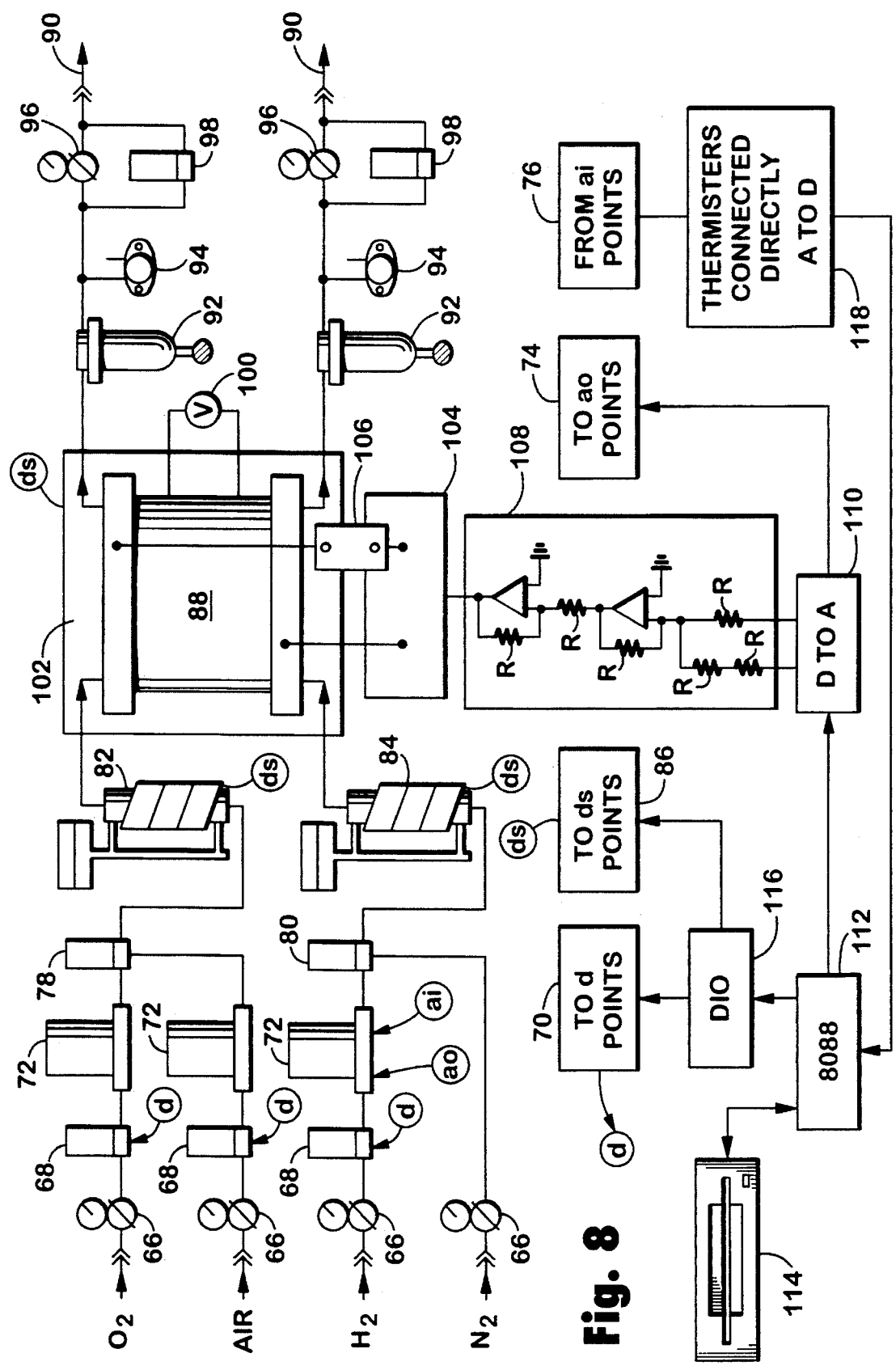
FIG. 8 depicts a schematic of an entire system for testing a fuel cell according to the present invention.

A humidifier like that just described was installed in the system depicted in FIG. 8. The system of FIG. 8 is a preferred embodiment incorporating a low capability microprocessor, such as an Intel 8088. The system includes a plurality of gas supplies, each of which is first directed to a feed gas pressure regulator 66 with an associated dial gauge. Oxygen, air, and hydrogen are then directed to a gas shut-off solenoid 68, an additional safety feature for automatic shutdown. Control for the solenoids 68 is provided by a mechanical relay panel 70 for 24 V DC power.

The gases, except for the nitrogen purge gas, is then passed to a mass flow controller 72 to precisely meter fuel cell gases. Each of the controllers 72 is coupled to an analog output buffer 74 that provides computer control of the mass flow. The controllers 72 also send data to a set of input amplifiers and buffers 76 for signal conditioning and subsequent use by the system for monitoring and control.

Air and oxygen are next directed to an oxidizer select solenoid 78, which can select, under computer control, which of these gases is to pass to the fuel cell as the oxidizer. Hydrogen and nitrogen as directed to a purge solenoid 80, which is used to purge the system to eliminate an explosive mixture of hydrogen.

The oxygen/air line then proceeds to a humidifier 82 and the hydrogen/nitrogen line proceeds to a humidifier 84. The heaters 58 of the humidifiers 82 and 84 are powered from a solid state relay panel 86 for 120 V.

These gases are then fed to a fuel cell 88, which vents the gases after the fuel cell reaction to vents 90, by way of exit water knock-out pots 92, pressure sensors 94, back pressure regulators 96, and back pressure venting solenoids 98. The system also provides a voltage display 100 of any appropriate means. A voltage reading from the voltage display and a pressure reading from each of the pressure sensors 94 is also provided to the input amplifiers and buffers for monitoring and control of the system. The fuel cell is also provided with a set of heaters 102 which are powered from the solid state relay panel 86 for 120 V.

Figure 2:
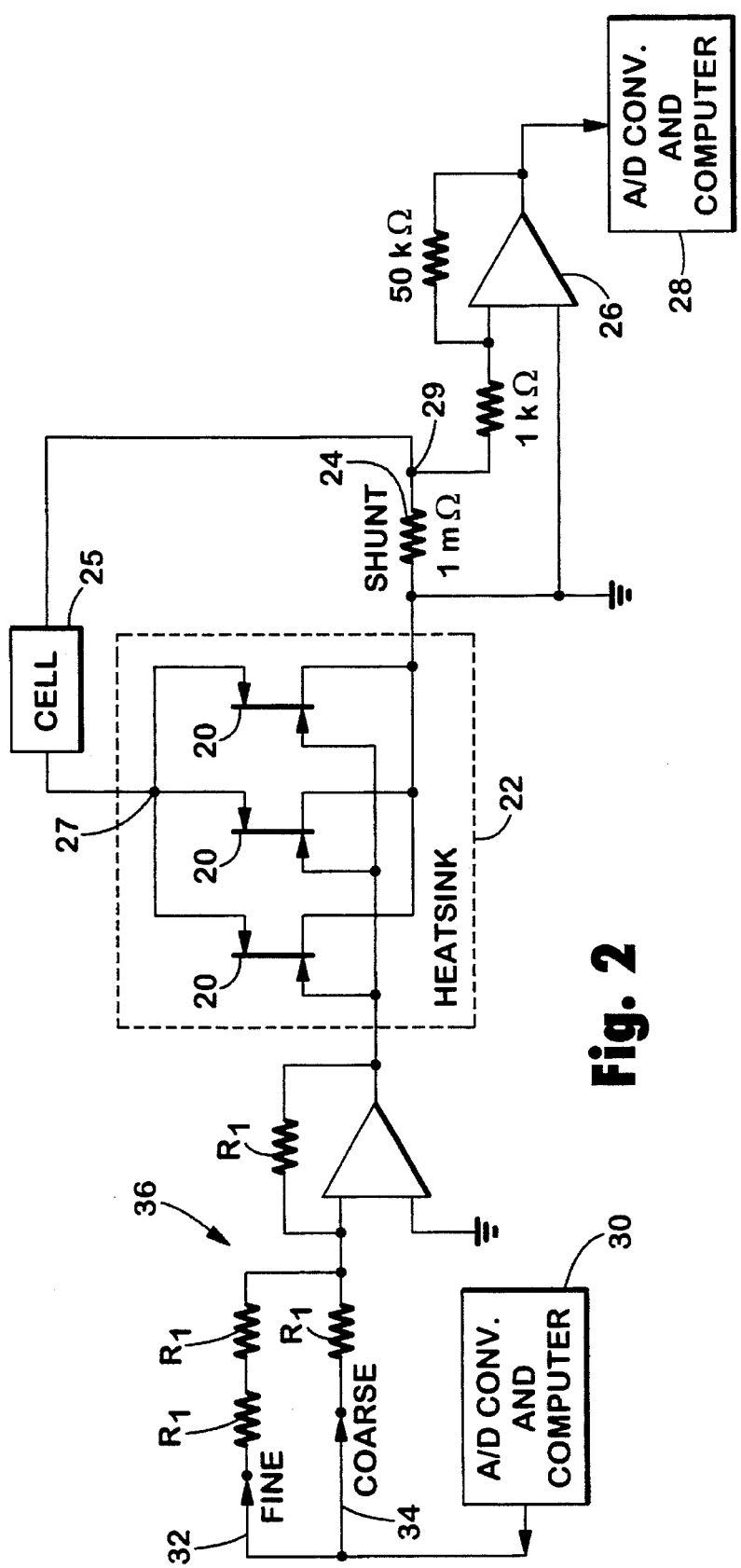
FIG. 2 depicts a preferred embodiment of the present invention including a plurality of parallel field effect transistors.

The fuel cell is coupled across a load bank 104, as previously described with regard to FIGS. 2 and 5. The load bank is connected through a metering shunt 106. Gate voltages of the FETs within the load bank are provided by an output summing amplifier 108 (see FIGS. 2 and 5). The amplifier 108 is powered by a DAC 110, under the control of a host processor 112, in this case an Intel 8088. Because of the limited capability of this processor, the system preferably includes a floppy disk drive 114. The processor 112 is also coupled to a digital output board 116 for issuing command and control signals. The processor 112 receives signals from throughout the system as previously described through an analog to digital converter 118.

As previously described, the processor 112 controlling the system also operates the heater on the outside of the humidifier shell to maintain the internal water temperature at the desired value. The same computer controls the mass flow controllers 72 to regulate the gas fed to the humidifiers 82 and 84. To test the humidifier's proper function, the water feed line 54 to the humidifier was connected to a burette. The amount of water consumed by evaporation was determined by reading the burette.

For this experiment the computer was utilized to maintain a set and stable temperature and gas flow rate. The water consumption was monitored as a function of time for a period of one to six hours and the effective dew point of the gas stream calculated from the amount of water which had evaporated. The results are shown in

TABLE II

| RUN | TEMPERATURE | RELATIVE HUMIDITY | DEW POINT |
|---|---|---|---|
| 1 | 35° C. | 95.9% | 34.3° C. |
| 2 | 50° C. | 100.1% | 50° C. |
| 3 | 55° C. | 102.4% | 55.5° C. |

In all three cases the amount of water consumed corresponded to the amount expected for a saturated gas stream at a temperature within 1° C. of the control point. Since the accuracy of the thermisters used to monitor the temperature is only ±1° C., this is within experimental error of ideal.

As previously described, FIG. 8 shows a system controlled by a low level microprocessor (Intel 8088). The minimum computing power needed to control the entire system is not great. This example demonstrates this by operating the entire system, load, gas flows, heaters, and sequencing using a 8 Megahertz (MHz) eight bit microprocessor (Intel 8088).

Figure 9:
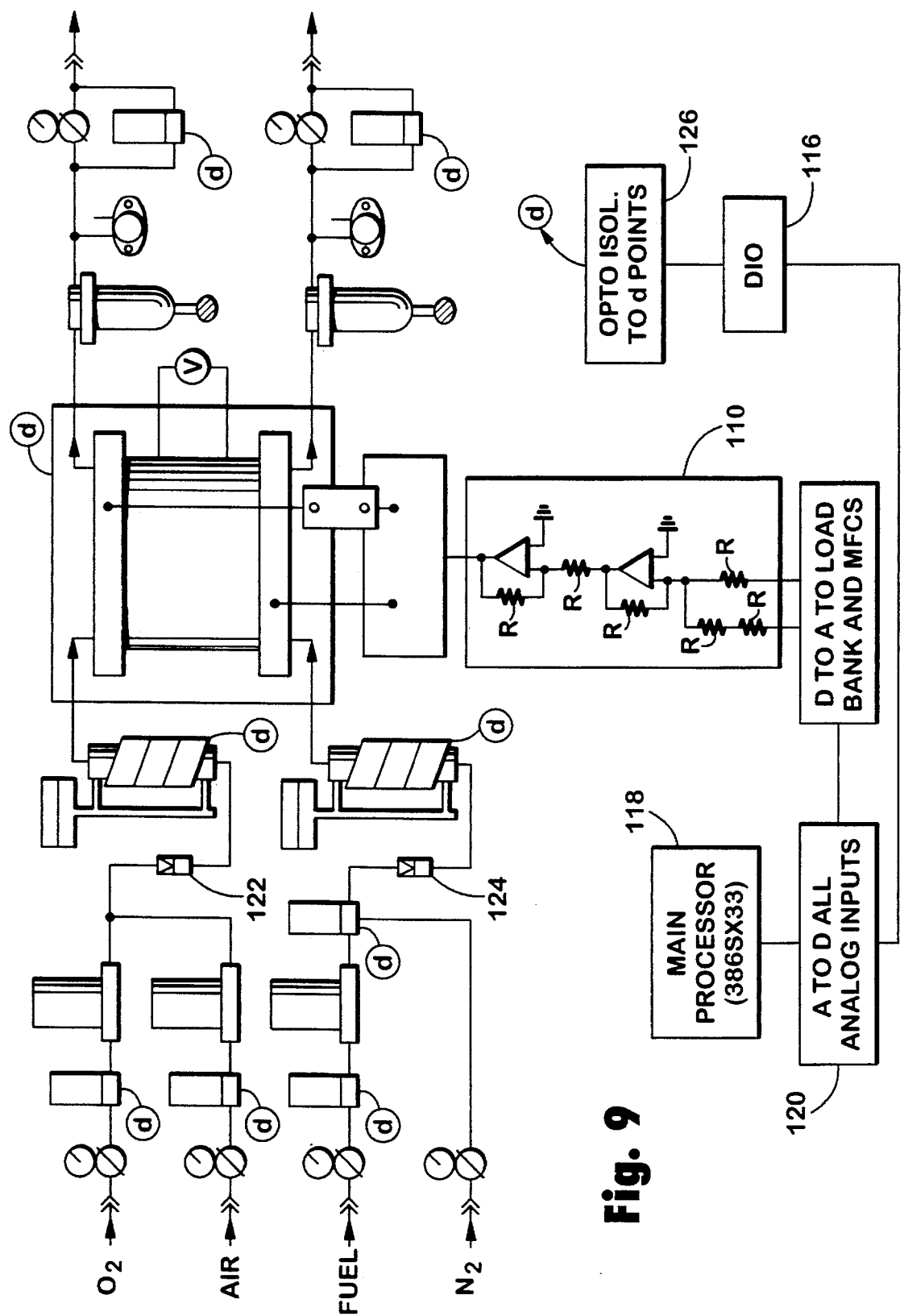
FIG. 9 depicts a schematic of the system of the present invention including control features of a 386SX based system.

FIG. 9 shows a system controlled by a typical current production microprocessor 120 (Advanced Micro Devices 386SX33). This system is similar to the one described in the embodiment of FIG. 8, except the embedded microprocessor is a more current design operating at 33 MHz and using a 32 bit instruction set. Increasing the sophistication of the microprocessor and associated hardware improves the functionality of the system, and rather simplifies the auxiliaries that support the microprocessor.

The gas flow system of the embodiment of FIG. 9 includes a pair of check valves 122 and 124 of conventional design. The computer control portion of this embodiment also includes an optically isolated solid state relay panel 126 for powering the various components as shown.

Figure 10:
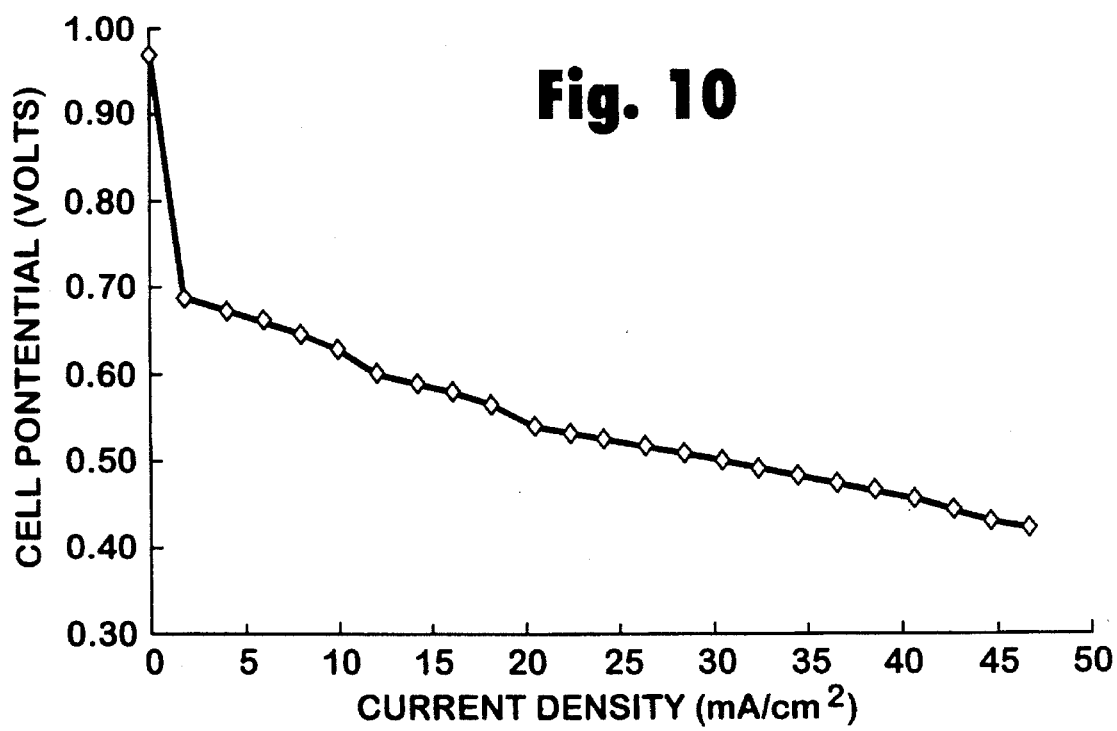
FIG. 10 depicts a polarization curve from a very low power fuel cell.

FIG. 10 shows the effectiveness of the larger load bank, even at low power levels. The 16 FET load bank previously described was operated using the system of FIG. 8 to determine the polarization of a small fuel cell. The cell was having problems with water building up in the electrode, a condition commonly described as flooding. This reduced its output to very low levels. Even under these conditions, the large load bank was able to control the cell.

The principles, preferred embodiment, and mode of operation of the present invention have been described in the foregoing specification. This invention is not to be construed as limited to the particular forms disclosed, since these are regarded as illustrative rather than restrictive. Moreover, variations and changes may be made by those skilled in the art without departing from the spirit of the invention.

We claim:

1. A system for testing an electrochemical energy generation or storage device comprising:
   a. a plurality of transistors coupled in parallel;
   b. nodes in series with the transistors adapted to receive an energy generation or storage device under test;
   c. a shunt in series with the energy generation or storage device and the transistors;
   d. means for sensing the current through the energy storage device under test; and
   e. means for varying the resistance of the transistors based upon the current sensed, said testing involving operating the device at a known and controlled current and measuring the voltage produced by the device at the current.

2. A method of testing an electrochemical energy storage device comprising the steps of:
   a. coupling an energy storage device in series with a plurality of parallel connected transistors;
   b. sensing the current through the energy storage device; and
   c. varying the resistance of the parallel connected transistors in response to the current sensed, said testing involving operating the device at a known and controlled current and measuring the voltage produced by the device at the current.

3. A system for testing electrochemical energy conversion and storage devices comprising:
   a. a variable resistance load circuit adapted to receive an energy conversion or storage device and thereby develop a load current, the load circuit including a plurality of field effect transistors coupled in parallel;
   b. sensors for sensing the load current and developing a load current signal;
   c. a central processor for receiving the load current signal and developing a control signal to the transistors to vary the function of the transistors in response to a change in the load current, said testing involving operating the device at a known and controlled current and measuring the voltage produced by the device at the current.

4. The system of claim 3 adapted for testing a fuel cell.

5. The system of claim 4 further comprising means of controlling the flow a gas to the fuel cell.

6. The system of claim 5 further comprising:
   a. means for sensing a predetermined parameter of the system to develop a parameter signal;

b. means for conducting the parameter signal to the central processor;

c. wherein the central processor further provides means of developing the control signal in response to the parameter signal; and d. means for conducting the control signal to a predetermined component of the system to carry out the control signal.

7. The system of claim 5 further comprising:

a. means for sensing a predetermined parameter of the system to develop a parameter signal in analog form;

b. an analog to digital converter to convert the parameter signal to digital form; and c. digital memory for storing the parameter signal in digital form.

8. The system of claim 4 further comprising a gas stream humidifier, the humidifier comprising:

a. an enclosed shell;

b. a gas inlet for admitting dry gas into the shell;

c. a gas outlet for venting humidified gas from the shell;

d. a plurality of water permeable tubes for carrying gas from the gas inlet to the gas outlet; and e. a water reservoir within the shell and outside the tubes for humidifying the gas.

9. A system for testing a fuel cell, the system comprising:

a. a variable resistance load circuit adapted to receive a fuel cell and thereby develop a load current, the load circuit including a plurality of field effect transistors coupled in parallel;

b. a gas supply and exhaust sub-system adapted to receive the fuel cell for the electrochemical generation of electricity;

c. electrical sensors for sensing the load current and developing a load current signal;

d. pressure sensors in the gas supply and exhaust sub-system to develop gas parameter signals;

e. a central processor for receiving the load current signal and developing a control signal to the transistors to vary the function of the transistors in response to a change in the load current;

f. the central processor also for receiving the gas parameter signals to control gas flow in the gas supply and exhaust subsystem, said testing involving operating the device at a known and controlled current and measuring the voltage produced by the device at the current.

10. The system of claim 9 further comprising a gas stream humidifier in the gas supply and exhaust sub-system.

11. The system of claim 10 wherein the gas stream humidifier comprises:

a. an enclosed shell;

b. a gas inlet for admitting dry gas into the shell;

c. a gas outlet for venting humidified gas from the shell;

d. a plurality of water permeable tubes for carrying gas from the gas inlet to the gas outlet; and e. a water reservoir within the shell and outside the tubes for humidifying the gas.

12. The system of claim 11 further comprising a heater outside the shell to heat the water in the reservoir.

13. The system of claim 12 wherein the heater is controlled by the central processor.

* * * * *